(12) United States Patent
Murakami (10) Patent No.: US 11,971,439 B2
(45) Date of Patent: Apr. 30, 2024

(54) FAULT DETECTION DEVICE

(71) Applicant: DENSO CORPORATION, Kariya (JP)

(72) Inventor: Bunsei Murakami, Kariya (JP)

(73) Assignee: DENSO CORPORATION, Kariya (JP)

(*) Notice: Subject to any disclaimer, the term of this patent is extended or adjusted under 35 U.S.C. 154(b) by 416 days.

(21) Appl. No.: 17/329,902

(22) Filed: May 25, 2021

(65) Prior Publication Data
US 2021/0278451 A1 Sep. 9, 2021

Related U.S. Application Data (63) Continuation of application No. PCT/JP2019/045348, filed on Nov. 20, 2019.

(30) Foreign Application Priority Data

Nov. 29, 2018 (JP) ................................. 2018-223639

(51) Int. Cl.
| | | |
|---|---|---|
| *G01R 29/10* | (2006.01) | |
| *H04B 17/16* | (2015.01) | |
| *H04B 17/17* | (2015.01) | |

(52) U.S. Cl.
CPC ............ *G01R 29/10* (2013.01); *H04B 17/16* (2015.01); *H04B 17/17* (2015.01)

(58) Field of Classification Search
None
See application file for complete search history.

(56) References Cited

U.S. PATENT DOCUMENTS

| | | | | |
|---|---|---|---|---|
| 2006/0222109 | A1* | 10/2006 | Watanabe | .......... H04L 27/2331 329/304 |
| 2009/0311977 | A1* | 12/2009 | Yamashita | .......... B60C 23/0416 455/91 |
| 2019/0013281 | A1* | 1/2019 | Elenes | ................. H03G 3/3036 |

FOREIGN PATENT DOCUMENTS

JP 2008224522 A 9/2008

OTHER PUBLICATIONS

Makuuchi Masami et al.; Device and Method for Examining Non-Contact IC Card; Publication Date Sep. 8, 2000; Hitachi LTD; JP 2000242746 A; IPC G06K17/00; G06K7/00 (Year: 2000).*
U.S. Appl. No. 17/330,045, filed May 25, 2021, Bunsei Murakami.

* cited by examiner

*Primary Examiner* — Nasima Monsur
(74) *Attorney, Agent, or Firm* — Harness, Dickey & Pierce, P.L.C.

(57) ABSTRACT

A fault detection device executes a test signal supply process for changing a frequency of a carrier wave within a frequency range predetermined as a range of a resonance frequency of an antenna, modulating the carrier wave with a test signal as an input signal, amplifying the carrier wave that is modulated, and supplying the carrier wave that is amplified as an output target signal to the antenna. While executing the test signal supply process, the fault detection device measures an antenna current corresponding to the frequency each time the frequency of the carrier wave is changed The fault detection device detects a fault caused by a difference or a change in a characteristic of the antenna by using a value of the antenna current on a larger side among the antenna currents measured during the test signal supply process.

8 Claims, 9 Drawing Sheets

FAULT DETECTION DEVICE

CROSS REFERENCE TO RELATED APPLICATIONS

The present application is a continuation application of International Patent Application No. PCT/JP2019/045348 filed on Nov. 20, 2019, which designated the U.S. and claims the benefit of priority from Japanese Patent Application No. 2018-223639 filed on Nov. 29, 2018. The entire disclosures of all of the above applications are incorporated herein by reference.

TECHNICAL FIELD

The present disclosure relates to a fault detection device.

BACKGROUND

A system that automatically opens and closes doors of a vehicle, locks and unlocks the doors of the vehicle, starts an engine, and the like by wireless communication between an in-vehicle device mounted on a vehicle and a portable terminal carried by a user of the vehicle has been used. Such a system is referred to, for example, a smart key system, a smart entry system, and a remote keyless entry system. For wireless communication between the in-vehicle device and the portable terminal in the above-described system, a signal in an LF (Low Frequency) frequency band, for example, a frequency band of 30 kHz to 300 kHz (hereinafter, referred to as an "LF signal") is used. As a configuration for outputting an LF signal, an antenna for transmitting the LF signal (hereinafter referred to as an "LF antenna") and a device or a circuit (hereinafter referred to as a "signal supply device") for supplying a signal to be output (hereinafter referred to as "output target signal") to the antenna are mounted to the vehicle.

SUMMARY

The present disclosure provides a fault detection device that executes a test signal supply process for changing a frequency of a carrier wave within a frequency range predetermined as a range of a resonance frequency of an antenna, modulating the carrier wave with a test signal as an input signal, amplifying the carrier wave that is modulated, and supplying the carrier wave that is amplified as an output target signal to the antenna. While executing the test signal supply process, the fault detection device measures an antenna current corresponding to the frequency each time the frequency of the carrier wave is changed. The fault detection device detects a fault caused by a difference or a change in a characteristic of the antenna by using a value of the antenna current on a larger side among the antenna currents measured during the test signal supply process.

BRIEF DESCRIPTION OF DRAWINGS

Objects, features and advantages of the present disclosure will become apparent from the following detailed description made with reference to the accompanying drawings. In the drawings.

DETAILED DESCRIPTION

An LF antenna must be properly assembled in a vehicle and properly electrically connected to a signal supply device. Therefore, as one step at a time of manufacturing the vehicle, an antenna connection diagnosis for diagnosing a connection normality between the LF antenna and the signal supply device may be performed. In an antenna connection diagnostic method, a diagnostic voltage is applied to an LF antenna from a signal supply device, a voltage waveform of the antenna after the voltage application is stopped is monitored, and when the voltage waveform has a predetermined shape, it is determined that the LF antenna and an antenna circuit are normally assembled with each other.

According to the antenna connection diagnosis method described above, abnormalities in the assembly of the LF antenna and the signal supply device, such as an LF antenna falling off from a vehicle body and a disconnection between the LF antenna and the antenna circuit, can be detected. However, the antenna connection diagnosis method described above cannot detect a fault caused by a difference or a change in an antenna characteristic. For example, the antenna connection diagnosis method described above cannot detect a fault that an antenna having a characteristic different from that of a correct LF antenna to be attached, that is, an LF antenna having an electric resistance value of a resistor, an inductance value of a coil, or a capacitance value of a capacitor different from that of the correct antenna is assembled to a signal supply device. Further, for example, even if the correct antenna is assembled, the resonance frequency of the LF antenna may be deviated from the drive frequency of the signal supply device and communication performance may be deteriorated due to a secular change in the characteristic of the LF antenna during actual use after the vehicle is manufactured. However, such a fault cannot be detected by the antenna connection diagnosis method described above.

Such an issue is common not only in LF signals but also in antennas and signal supply devices for outputting signals of any other frequency band. Therefore, a technique capable of detecting a fault caused by a difference or change in an antenna characteristic is desired.

According to one aspect of the present disclosure, a fault detection device for detecting a fault of an antenna includes a frequency adjuster configured to adjust a frequency of a carrier wave, a modulator configured to modulate the carrier wave with an input signal, an amplifier configured to amplify the input signal that is modulated to generate an output target signal and supply the output target signal to the antenna, a current measurer configured to measure an antenna current that flows through the antenna, a fault detector configured to detect the fault, and a controller. While the controller executes a test signal supply process in which the controller controls the frequency adjuster to change the frequency of the carrier wave within a frequency range predetermined as a range of a resonance frequency of the antenna, controls the modulator to modulate the carrier wave with a test signal as the input signal, controls the amplifier to amplify the carrier wave that is modulated and supply the carrier wave that is amplified to the antenna, the controller controls the current measurer to measure the antenna current corresponding to the frequency each time the frequency of the carrier wave is changed. The fault detector detects a fault caused by a difference or a change in a characteristic of the antenna by using a value of the antenna current on a larger side among the antenna currents measured during execution of the test signal supply process.

According to the fault detection device of this aspect, since the value of the antenna current on the larger side among the antenna currents measured during the execution of the test signal supply process is used to detect the fault caused by the difference or the change in the antenna characteristic, it is possible to detect the fault caused by the difference or the change in the antenna characteristic. When a deviation between the resonance frequency of the antenna and the frequency of the carrier wave is small, the measured antenna current becomes large. Therefore, the frequency of the carrier wave when the antenna current on the larger side among the antenna currents measured during the test signal supply process is the frequency on a side where the deviation from the resonance frequency of the antenna is small. The frequency with the smaller deviation from the resonance frequency of the antenna differs depending on the antenna characteristic. Therefore, by using the frequency that differs depending on the characteristic of the antenna, it is possible to accurately detect the fault caused by the difference or the change in the characteristic of the antenna.

The present disclosure can also be realized in various forms other than the fault detection device. For example, the present disclosure can also be realized in the form of a vehicle control device, a vehicle system, a smart key system, a smart entry system, a smart keyless entry system, a fault detection method, a computer program for realizing such a method, a storage medium for storing the computer program, or the like.

A. First Embodiment

A1. Device Configuration

Figure 1:
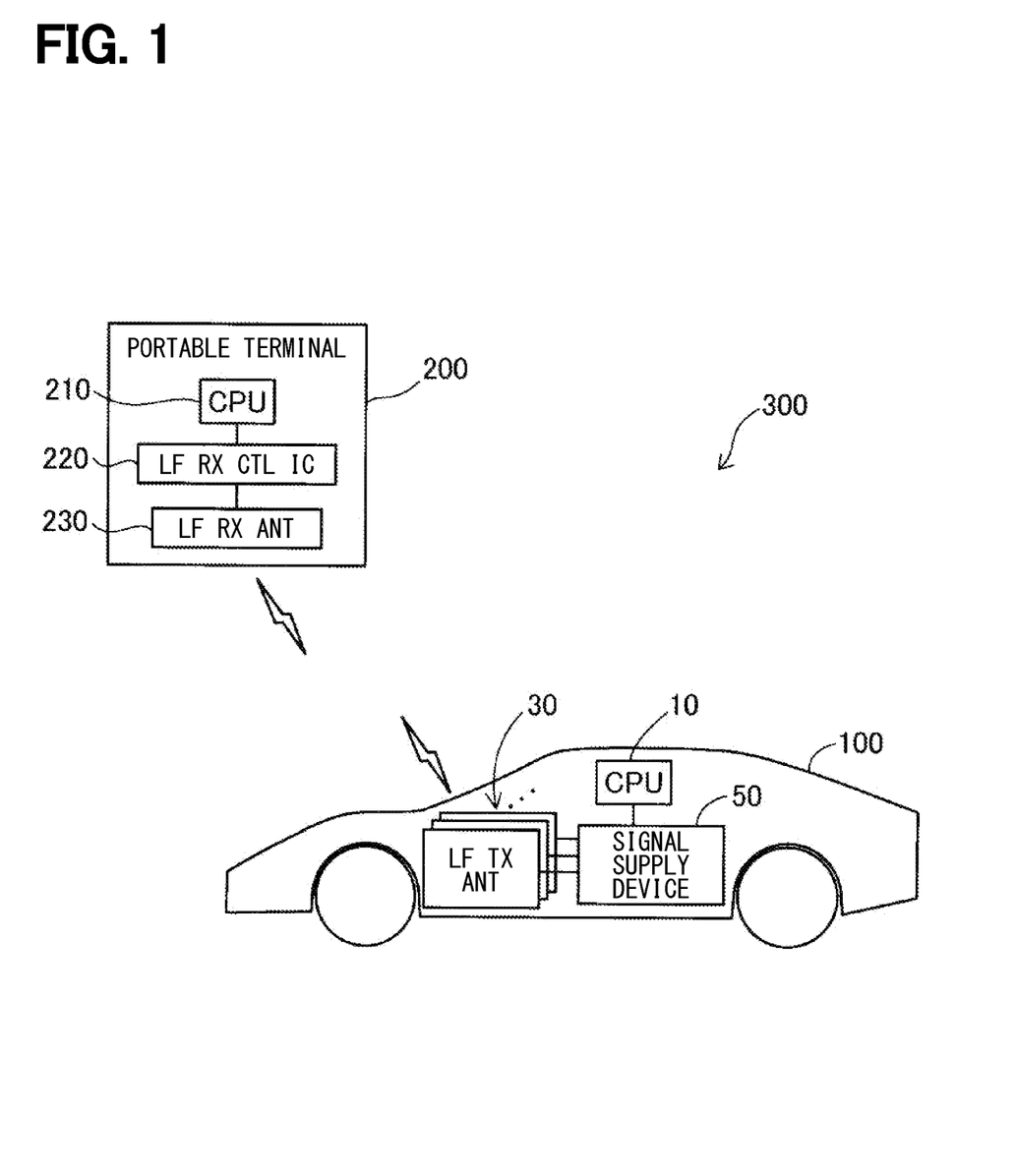
FIG. 1 is an explanatory diagram showing a schematic configuration of a vehicle equipped with a signal supply device as an embodiment of a fault detection device of the present disclosure.

A vehicle system 300 shown in FIG. 1 is a system that realizes remote keyless entry by wirelessly communicating with each other between a vehicle 100 and a portable terminal 200. The remote keyless entry means that when a user of the vehicle 100 operates a switch (not shown) of the portable terminal 200, a door of the vehicle 100 is opened, closed, unlocked, locked, etc. according to the operation. A smart entry may be realized instead of the remote keyless entry or in addition to the remote keyless entry. The smart entry means that the door of the vehicle 100 is unlocked when the user of the vehicle 100 carrying the portable terminal 200 enters a wireless communication area near the vehicle 100, and that the vehicle 100 is started by the user sitting in the driver's seat while carrying the portable terminal 200 and operating a predetermined switch.

The vehicle 100 and the portable terminal 200 transmit and receive signals in a Low frequency (LF) band (hereinafter referred to as "LF signals") and signals in an ultra-high frequency (UHF) band (hereinafter referred to as "UHF signals"). The LF band means, for example, a frequency band of 30 kHz to 300 kHz. The UHF band means, for example, a frequency band of 300 MHz to 3 GHz.

As shown in FIG. 1, the vehicle system 300 includes a CPU 10 mounted on the vehicle 100, a signal supply device 50, LF transmission antennas (LF TX ANTS) 30, and the portable terminal 200. In the present embodiment, the CPU 10 constitutes a part of an ECU (Electronic controller) as a so-called in-vehicle device. By executing a control program stored in a memory included in the ECU, the CPU 10 executes a function as the in-vehicle device, for example, control of exchange of various signals with the portable terminal 200, authentication process of the portable terminal 200, and the like.

Figure 2:
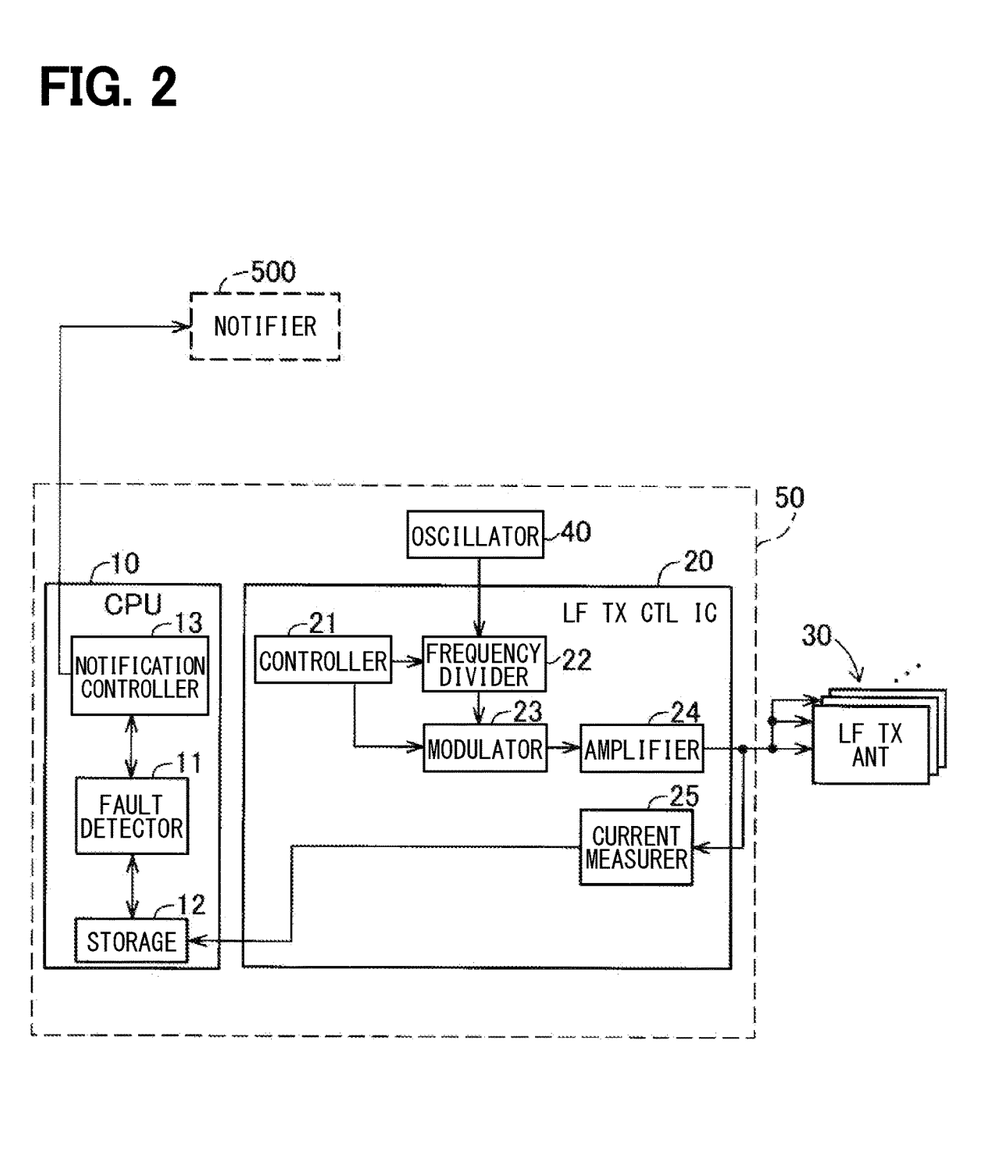
FIG. 2 is a block diagram showing a configuration of a signal supply device according to a first embodiment.

Further, as shown in FIG. 2, the CPU 10 not only realizes the function as the in-vehicle device, but also functions as a fault detector 11, a storage 12, and a notification controller 13. The fault detector 11 detects a fault in the LF transmission antenna 30. In the present embodiment, as a fault of the LF transmission antenna 30, a fault that an erroneous antenna different from a correct antenna is assembled as the LF transmission antenna 30 to the signal supply device 50 is detected. Details of such a fault will be described later. The storage 12 is composed of a rewritable non-volatile memory, for example, an EEPROM (Electrically Erasable Programmable Read-Only Memory). The storage 12 stores an antenna current value measured in a fault detection process described later. The notification controller 13 controls the notifier 500 connected to the signal supply device 50, and when a fault is detected by the fault detector 11, notifies the detection of the fault. In the present embodiment, the notifier 500 is electrically connected to the signal supply device 50 in a test process at a time of manufacturing the vehicle 100. In the present embodiment, the notifier 500 has a liquid crystal display and displays various messages under the control of the notification controller 13.

As shown in FIGS. 1 and 2, the signal supply device 50 is electrically connected to the CPU 10 and each of the LF transmission antennas 30. The signal supply device 50 supplies the LF signal to each of the LF transmission antennas 30 under the control of the CPU 10. The signal supply device 50 also functions as a fault detection device that executes the fault detection process described later. In the present embodiment, the fault detection process is executed as one step of a test performed at the time of manufacturing the vehicle 100. The details of the fault detection process will be described later.

As shown in FIG. 2, the signal supply device 50 includes an oscillator 40 and an LF transmission control IC (LF TX CTL) 20. The oscillator 40 outputs a signal of a predetermined frequency, for example, a sine wave signal of 16 MHz (megahertz). The signal of any frequency may be output, not limited to 16 MHz. The oscillator 40 may be composed of, for example, a crystal oscillator.

The LF transmission control IC 20 includes a controller 21, a frequency divider 22, a modulator 23, an amplifier 24, and a current measurer 25.

The controller 21 controls the overall operation of the LF transmission control IC 20. For example, the controller 21 controls the frequency divider 22 so that frequency of a carrier wave becomes a preset frequency. Further, for example, when the controller 21 receives an input signal to be transmitted as an LF signal from the CPU 10, the controller 21 passes the signal to the modulator 23 and controls the modulator 23 to modulate a carrier wave.

Under the control of the controller 21, the frequency divider 22 divides a signal having a predetermined frequency output from the oscillator 40 to generate and output the carrier wave having a usage frequency. The "usage frequency" means the frequency used in the normal state as the frequency of the carrier wave for transmitting the LF signal. The "normal state" means a state in which power is supplied to the signal supply device 50 after the vehicle 100 is shipped. In the present embodiment, a predetermined value is set in advance as an initial value f(int) of the usage frequency. The details of the initial value f(int) will be described later.

The modulator 23 modulates the carrier wave output from the frequency divider 22 by the input signal received from the controller 21. The amplifier 24 amplifies the modulated carrier wave to generate an LF signal, and supplies the LF signal to the LF transmission antenna 30. The current measurer 25 measures the current flowing through the LF transmission antenna 30 (hereinafter, referred to as "antenna current"), and stores the current value of the measurement result in the storage 26. The storage 26 has a storage capacity capable of storing at least all the current values measured by the current measurer 25 during execution of usage frequency adjustment process described later.

The controller 21 and the frequency divider 22 described above correspond to a subordinate concept of a frequency adjuster in the present disclosure.

Each of the LF transmission antenna 30 is electrically connected to the signal supply device 50, and outputs the LF signal supplied from the signal supply device 50 as a radio wave. In the present embodiment, each of the LF transmission antennas 30 includes an RLC circuit. As each of the LF transmission antennas 30, an antenna whose antenna characteristic has been adjusted in advance so that the resonance frequency becomes a predetermined resonance frequency is used. The antenna characteristic means, for example, a resistance value of a resistor, an inductance of a coil, a capacitance of a capacitor, and the like. However, the resonance frequencies of the LF transmission antennas 30 vary within a range of a design tolerance. Each of the LF transmission antenna 30 is installed at a different location in the vehicle 100. For example, each of the LF transmission antennas 30 is arranged in a driver's seat door, a passenger seat door, and a rear seat door, between a driver's seat and a passenger seat, between a rear seat and a trunk room, or the like The output power of the LF signal output from each of the LF transmission antennas 30 is adjusted in the range of several tens of cm (centimeters) to several m (meters) centered on each of the LF transmission antennas so as to be received by the portable terminal 200 with a predetermined reception signal strength. In this way, by limiting the receivable area of the LF signal to a relatively narrow range, it is possible to specify the rough position of the portable terminal 200.

The vehicle 100 is equipped with various devices related to the reception of UHF signals, but in the present embodiment, illustration and detailed description thereof will be omitted. The various devices related to the reception of the UHF signal correspond to, for example, an antenna for receiving the UHF signal, and an IC that amplifies or encodes the signal received by the antenna and extracts the signal.

As shown in FIG. 1, the portable terminal 200 includes a CPU 210, an LF reception control IC (LF RX CTL IC) 220, and an LF reception antenna (LF RX ANT) 230. In addition to controlling the overall operation of the portable terminal 200, the CPU 210 exchanges various signals with the ECU as the in-vehicle device. For example, when receiving the LF signal, the CPU 210 controls the LF reception control IC 220 and transmits a response signal including an identifier preset in the portable terminal 200 as a UHF signal. The LF reception control IC 220 is electrically connected to the CPU 210 and executes various processes related to the reception of the LF signal under the control of the CPU 210. Specifically, the LF reception control IC 220 amplifies and encodes the signal received from the LF reception antenna 230. The LF reception antenna 230 is electrically connected to the LF reception control IC 220, receives the LF signal, and passes the received signal to the LF reception control IC 220. The portable terminal 200 is equipped with various devices related to transmission of UHF signals, but in the present embodiment, illustration and detailed description thereof will be omitted. The various devices related to the transmission of the UHF signals correspond to, for example, an antenna for transmitting a UHF signal, an IC for generating a signal to be supplied to the antenna, and the like.

As described above, in the vehicle 100, as each of the LF transmission antennas 30, the antenna whose antenna characteristic is adjusted in advance so that the resonance frequency becomes the predetermined resonance frequency is used. However, in the manufacturing process of the vehicle 100, there is a possibility that an antenna different from the antenna whose antenna characteristic is adjusted as described above is erroneously assembled to the signal supply device 50. For example, an antenna having substantially the same appearance and different antenna characteristic may be erroneously assembled as the LF transmission antenna 30. In such a case, the resonance frequency of the LF transmission antenna 30 deviates from the predetermined resonance frequency, which may cause a deviation between the drive frequency of the signal supply device 50, that is, the usage frequency and the resonance frequency of the LF transmission antenna 30. If the usage frequency and the resonance frequency of the LF transmission antenna 30 deviate from each other in this way, the strength of the LF signal varies, and the accuracy of specifying the position of the portable terminal 200 may decrease. Therefore, in the present embodiment, when the vehicle 100 is manufactured, the signal supply device 50 is used as the fault detection device to execute the fault detection process described later so that the presence or absence of a fault that the correct antenna having the predetermined antenna characteristic is not assembled as the LF transmission antenna 30 is detected and the detection result is notified.

A2. Fault Detection Process

In the test process at the time of manufacturing the vehicle 100, the fault detection process is executed. In the present embodiment, the fault detection process is a process for detecting a fault that an erroneous antenna different from the correct antenna is assembled as the LF transmission antenna 30 to the signal supply device 50. Before executing such a fault detection process, the signal supply device 50 and the notifier 500 are electrically connected by a dedicated wiring. Instead of the dedicated wiring, the signal supply device 50 and the notifier 500 may be connected via a network provided in the vehicle 100, for example, CAN (Control Area Network). When an operator instructs the signal supply device 50 to execute the fault detection process, the fault detection process is started. In the present embodiment, the instruction is realized by displaying a menu screen for a test on a display provided on an instrument panel of the vehicle 100 and selecting "fault detection process" on the menu screen to instruct execution of the fault detection process. The fault detection process is performed for each of the LF transmission antennas 30.

Figure 3:
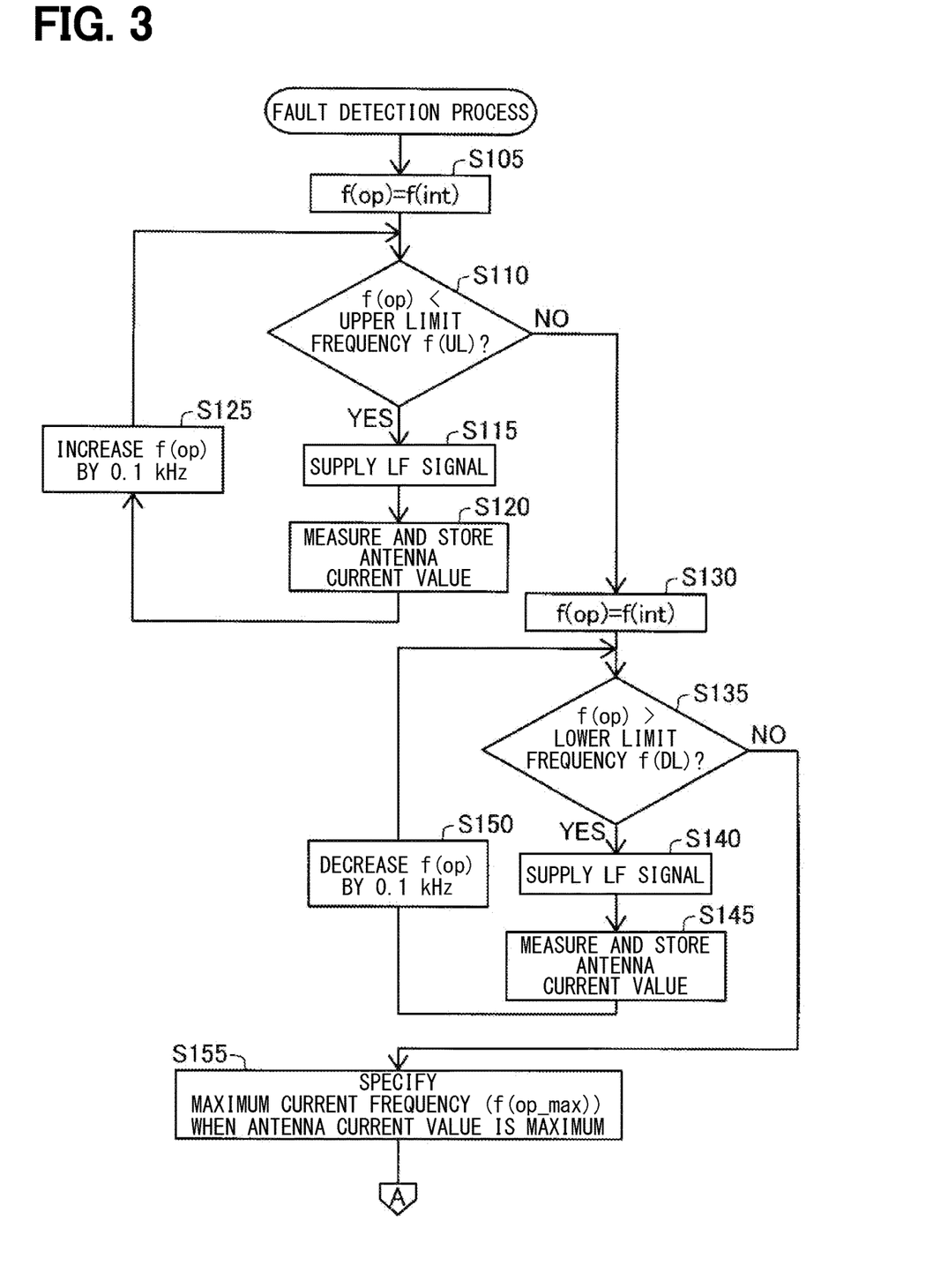
FIG. 3 is a flowchart showing a procedure of a fault detection process according to the first embodiment.

As shown in FIG. 3, the controller 21 sets an initial value f(int) as the frequency f(op) of the carrier wave (S105). In the present embodiment, the initial value f(int) is set to the median value of the design tolerance of the resonance frequency of the LF transmission antenna 30. Specifically, the design tolerance of the resonance frequency of the LF transmission antenna 30 is 120 kHz to 130 kHz, and the initial value f(int) is 125 kHz. The design tolerance is not limited to 120 kHz to 130 kHz. Further, the initial value f(int) is not limited to the median value, and may be set to any value within the range of the design tolerance. Therefore, for example, the design tolerance may be 110 kHz to 140 kHz, and the initial value f(int) may be 134 kHz.

The controller 21 determines whether or not the frequency f(op) of the carrier wave is lower than an upper limit frequency f(UL) within the design tolerance of the LF transmission antenna 30 (S110). When it is determined that the frequency f(op) is lower than the upper limit frequency f(UL) (130 kHz) (S110: YES), the controller 21 supplies a test signal as the LF signal to the LF transmission antenna 30 (S115). For example, a signal having a predetermined length in which "0" and "1" appear alternately may be used as the test signal. The controller 21 controls the frequency divider 22 to generate the carrier wave having the frequency f(op), controls the modulator 23 to modulate the carrier wave with the test signal, and controls the amplifier 24 to amplify the carrier wave after modulation and supplies the test signal as the LF signal to the LF transmission antenna 30.

The current measurer 25 measures the antenna current when the test signal (LF signal) is supplied to the LF transmission antenna 30, and stores the antenna current in the storage 26 (S120). At this time, the measured antenna current value and the frequency f(op) of the carrier wave at this time are stored in association with each other.

The controller 21 increases the frequency f(op) of the carrier wave by 0.1 kHz (S125). After the execution of S125, the above-described S110 is executed. In this way, the supply of the test signal (LF signal) (S115), measurement of the antenna current (S120), and increase of the frequency f(op) by 0.1 kHz are repeatedly executed until the frequency f(op) of the carrier wave reaches the upper limit frequency f(UL). Therefore, every time the frequency f(op) of the carrier wave is increased by 0.1 kHz, the carrier wave of such frequency f(op) is modulated with the test signal, and the antenna current when the obtained LF signal is amplified and supplied to the LF transmission antenna 30 is detected. The amount of frequency increase is not limited to 0.1 kHz and may be any value.

In S110 described above, when it is determined that the frequency f(op) is not lower than the upper limit frequency f(UL), that is, is equal to or higher than the upper limit frequency f(UL) (S110: NO), the controller 21 sets the initial value f(int) as the frequency f(op) of the carrier wave (S130). This S130 is the same as S105 described above.

The controller 21 determines whether or not the frequency f(op) of the carrier wave is higher than a lower limit frequency f(DL) within the design tolerance of the LF transmission antenna 30 (S135). When it is determined that the frequency f(op) is higher than the lower limit frequency f(DL) (120 kHz) (S135: YES), the controller 21 supplies the test signal as the LF signal to the LF transmission antenna 30 (S140). This S140 is the same as S115 described above. The current measurer 25 measures the antenna current when the test signal (LF signal) is supplied to the LF transmission antenna 30, and stores the antenna current in the storage 26 (S145). This S145 is the same as S120 described above.

The controller 21 decreases the frequency f(op) of the carrier wave by 0.1 kHz (S150). After the execution of S150, the above-described S135 is executed. In this way, the supply of the test signal (LF signal) (S140), measurement of the antenna current (S145), and decrease of the frequency f(op) by 0.1 kHz are repeatedly executed until the frequency f(op) of the carrier wave reaches the lower limit frequency f(DL). Therefore, every time the frequency f(op) of the carrier wave is decreased by 0.1 kHz, the carrier wave of such frequency f(op) is modulated with the test signal, and the antenna current when the obtained LF signal is amplified and supplied to the LF transmission antenna 30 is detected. In the present embodiment, S105 to S115, S125 to S140, and S150 described above are referred to as test signal supply process. Therefore, S105 to S150 described above can be said to be a process of measuring the antenna current corresponding to each frequency f(op) of the carrier wave and storing the antenna current in the storage 26 while executing the test signal supply process.

In S135 described above, when it is determined that the frequency f(op) is not higher than the lower limit frequency f(DL) (120 kHz), that is, is equal to or lower than the lower limit frequency f(DL) (S135: NO), the fault detector 11 specifies the frequency f(op) when the antenna current value stored in the storage 26 is maximum (S155). In the present embodiment, the frequency f(op) when the antenna current value is maximum is also referred to as the maximum current frequency f(op_max).

Figure 4:
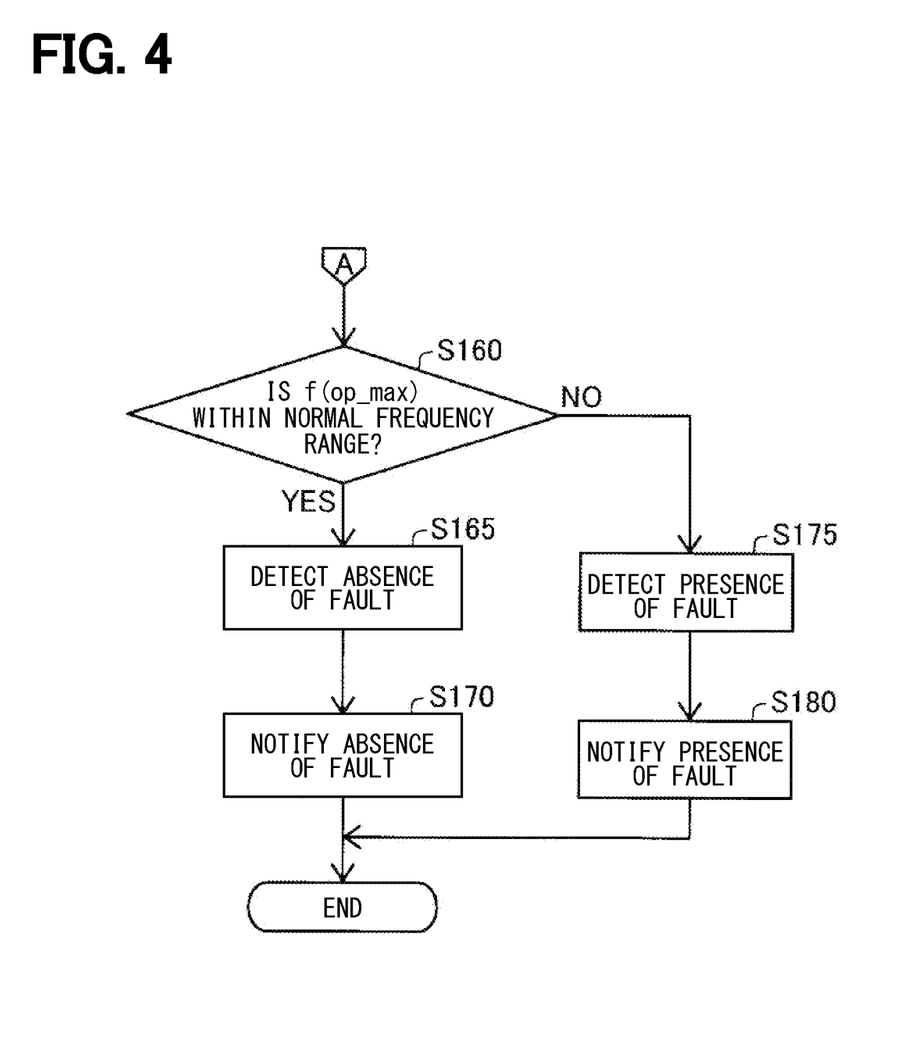
FIG. 4 is a flowchart showing a procedure of the fault detection process according to the first embodiment.

As shown in FIG. 4, the fault detector 11 determines whether or not the maximum current frequency f(op_max) is within a normal frequency range (S160). The normal frequency range means a frequency range corresponding to a current value assumed when the test signal supply process is executed in a state where the correct LF transmission antenna 30 is normally assembled to the signal supply device 50, and is specified and set in advance by experiments. When the deviation between the resonance frequency of the LF transmission antenna 30 and the frequency f(op) of the carrier wave is small, the antenna current has a large value. Therefore, in a case where the frequency f(op) is changed within the range of the design tolerance, the maximum current frequency f(op_max) when the antenna current is the maximum is the frequency having the smallest deviation from the resonance frequency of the LF transmission antenna 30. The maximum current frequency f(op_max) is a frequency that varies greatly depending on the characteristic of the antenna.

When it is determined that the maximum current frequency f(op_max) is within the normal frequency range (S160: YES), the fault detector 11 detects the absence of a fault (S165), and controls the notifier 500 to notify the absence of a fault (S170). In the present embodiment, the notification in S170 means that the liquid crystal display included in the notifier 500 displays a message of "absence of fault".

On the other hand, when it is determined that the maximum current frequency f(op_max) is not within the normal frequency range (S160: NO), the fault detector 11 detects the presence of a fault (S175), and controls the notifier 500 to notify the presence of a fault (S180). After executing S170 or S180 described above, the fault detection process ends.

As described above, the maximum current frequency f(op_max) is a frequency that varies greatly depending on the characteristic of the antenna. Therefore, when the correct antenna is normally assembled as the LF transmission antenna 30 to the signal supply device 50, the maximum current frequency f(op_max) is a value within the normal frequency range. On the other hand, when an erroneous antenna is assembled as the LF transmission antenna 30 to the signal supply device 50, the maximum current frequency f(op_max) becomes a value outside the normal frequency range. Therefore, by executing the above-described fault detection process, a fault in which an erroneous antenna different from the correct antenna is assembled as the LF transmission antenna to the signal supply device 50 can be detected with high accuracy.

According to the signal supply device 50 of the first embodiment described above, that is, the fault detection device, the value of the maximum antenna current among the antenna currents measured during the execution of the test signal supply process is used to detect the presence or absence of a fault in which an erroneous antenna is assembled as the LF transmission antenna 30 to the signal supply device 50. Therefore, it is possible to accurately detect the fault in which the erroneous antenna is assembled as the LF transmission antenna 30 to the signal supply device 50. When the deviation between the resonance frequency of the antenna and the frequency of the carrier wave is small, the measured antenna current becomes large. Therefore, among the antenna currents measured during the test signal supply process, the frequency of the carrier wave when the maximum antenna current is measured (maximum current frequency f(op_max)) has the smallest deviation from the resonance frequency of the antenna. The frequency with the smallest deviation from the resonance frequency of the antenna differs depending on the characteristic of the antenna. Therefore, by using the maximum current value frequency f(op_max) that differs depending on the characteristic of the antenna, it is possible to accurately detect a fault in which an erroneous antenna is assembled as the LF transmission antenna 30 to the signal supply device 50.

Further, in the test signal supply process, the controller 21 increases the frequency f(op) within the frequency range of the design tolerance in order from the initial value f(int) predetermined as the usage frequency, and when the frequency f(op) reaches the upper limit frequency f(UL), the controller 21 decreases the frequency f(op) in the frequency range of the design tolerance from the initial value f(int) to the lower limit frequency f(DL). Therefore, the frequency of the carrier wave can be changed at intervals of the predetermined frequency (0.1 kHz) without omission over the entire frequency range of the design tolerance.

Further, the signal supply device 50 includes the storage 26 for storing the value of the antenna current measured for each frequency f(op) of the carrier wave, and when the frequency setter 27 sets the usage frequency with reference to the value of the antenna current stored in the storage 26, the frequency setter 27 can easily specify the maximum antenna current among the antenna currents measured during the test signal supply process.

B. Second Embodiment

Since the device configuration of the signal supply device 50 of the second embodiment is the same as that of the signal supply device 50 of the first embodiment, the same components are designated by the same reference numerals, and detailed description thereof will be omitted. In the frequency adjustment process of the first embodiment, when the frequency f(op) is changed by the predetermined frequency (0.1 kHz) within the frequency range of the design tolerance, the frequency f(op) is gradually increased from the initial value f(int), and when the frequency f(op) reaches the upper limit frequency f(UL) of the frequency range, the frequency f(op) is returned to the initial value f(int), and is decreased from the initial value f(int) to the lower limit frequency f(DL). On the other hand, in a usage frequency adjustment process of the second embodiment, the frequency f(op) is sequentially increased from the lower limit frequency f(DL) to the upper limit frequency f(UL). Hereinafter, a specific description will be given with reference to FIG. 5.

Figure 5:
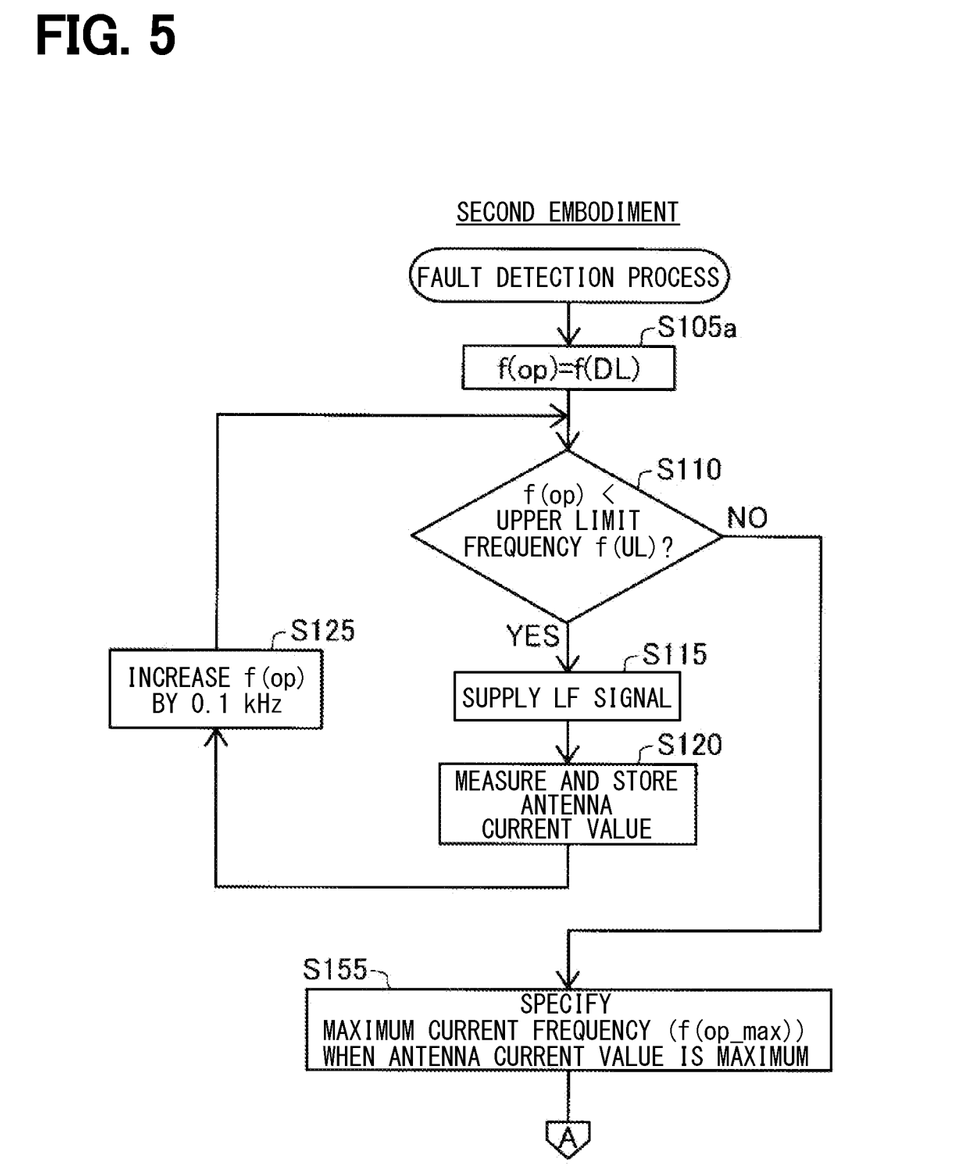
FIG. 5 is a flowchart showing a procedure of a fault detection process according to a second embodiment.

The fault detection process of the second embodiment shown in FIG. 5 is different from the fault detection process of the first embodiment shown in FIG. 3 in that the fault detection process of the second embodiment includes S105a instead of the S105, and S130 to S150 are omitted. Since the other procedure of the fault detection process of the second embodiment are the same as those of the fault detection process of the first embodiment, the same procedure are designated by the same reference numerals and detailed description thereof will be omitted.

As shown in FIG. 5, the controller 21 sets the lower limit frequency f(DL) as the frequency f(op) of the carrier wave (S105a). After that, S110 to S125 described above are executed. In S110, when it is determined that the frequency f(op) is not lower than the upper limit frequency f(UL), that is, is equal to or higher than the upper limit frequency f(UL) (S110: NO), the above-described procedures in S155 and subsequent steps are executed. That is, the frequency f(op) is increased by 0.1 kHz from the lower limit frequency f(DL) to the upper limit frequency f(UL), and when the frequency f(op) reaches the upper limit frequency f(UL), the maximum current frequency f(op_max) at the time of the maximum value among the antenna current stored by that time is specified, and the presence or absence of a fault is detected based on the maximum current frequency f(op_max), and notification is executed.

According to the signal supply device 50 of the second embodiment described above, effects similar to those of the signal supply device 50 of the first embodiment can be obtained.

C. Third Embodiment

Since the device configuration of the signal supply device 50 of the third embodiment is the same as that of the signal supply device 50 of the first embodiment, the same components are designated by the same reference numerals, and detailed description thereof will be omitted. In the frequency adjustment process of the first embodiment, when the frequency f(op) is changed by the predetermined frequency (0.1 kHz) within the frequency range of the design tolerance, the frequency f(op) is gradually increased from the initial value f(int), and when the frequency f(op) reaches the upper limit frequency f(UL) of the frequency range, the frequency f(op) is returned to the initial value f(int), and is decreased from the initial value f(int) to the lower limit frequency f(DL). On the other hand, in a usage frequency adjustment process of the third embodiment, the frequency f(op) is sequentially decreased from the upper limit frequency f(UL) to the lower limit frequency f(DL). Hereinafter, a specific description will be given with reference to FIG. 6.

Figure 6:
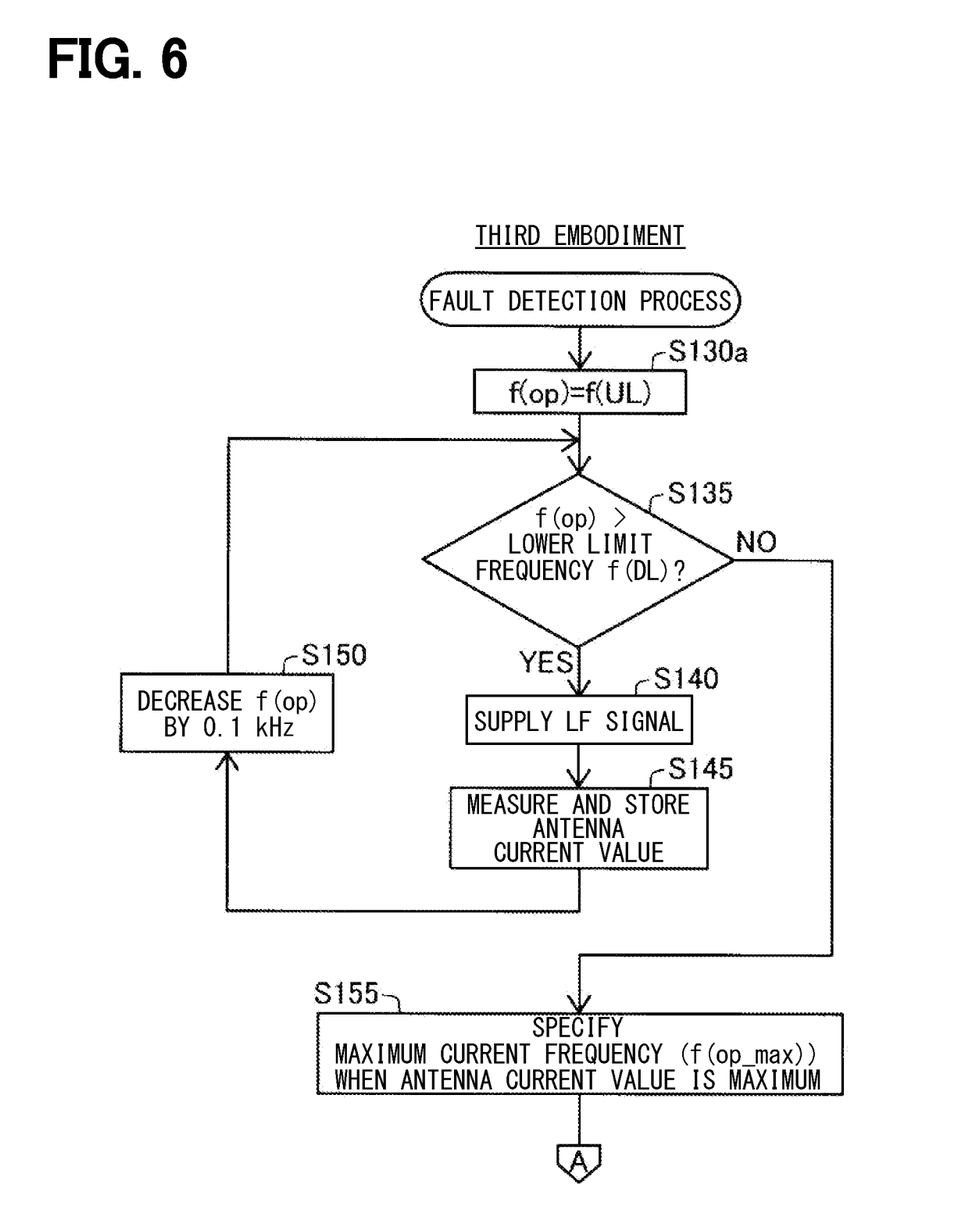
FIG. 6 is a flowchart showing a procedure of a fault detection process according to a third embodiment.

The fault detection process of the third embodiment shown in FIG. 6 is different from the fault detection process of the first embodiment shown in FIG. 3 in that S105 to S125 are omitted and S130a is included instead of the S130. Since the other procedure of the fault detection process of the third embodiment are the same as those of the fault detection process of the first embodiment, the same procedure are designated by the same reference numerals and detailed description thereof will be omitted.

As shown in FIG. 6, the controller 21 sets the upper limit frequency f(UL) as the frequency f(op) of the carrier wave (S130a). After that, S135 to S160 are executed. That is, the frequency f(op) is decreased by 0.1 kHz from the upper limit frequency f(UL) to the lower limit frequency f(DL), and when the frequency f(op) reaches the lower limit frequency f(DL), the maximum current frequency f(op_max) at the time of the maximum value among the antenna current stored by that time is specified, and the presence or absence of a fault is detected based on the maximum current frequency f(op_max), and notification is executed.

According to the signal supply device 50 of the third embodiment described above, effects similar to those of the signal supply device 50 of the first embodiment can be obtained.

D. Fourth Embodiment

Since the device configuration of the signal supply device 50 of the fourth embodiment is the same as those of the signal supply devices 50 of the first and second embodiments, the same components are designated by the same reference numerals, and detailed description thereof will be omitted. In the frequency adjustment process of the second embodiment, the frequency f(op) is increased by 0.1 kHz from the lower limit frequency f(DL) to the upper limit frequency f(UL), and when the frequency f(op) is reached the upper limit frequency f(UL), the frequency f(op) at the maximum value among the antenna currents stored by that time is specified, and the specified frequency f(op) is set as the usage frequency. The usage frequency adjustment process of the fourth embodiment is the same as that of the second embodiment in that the frequency is increased by 0.1 kHz from the lower limit frequency f(DL) to the upper limit frequency f(UL). However, when an inflection point of the antenna current value occurs during the increase, the increase is stopped, the presence or absence of a fault is detected and notified. Hereinafter, a detailed description will be given with reference to FIG. 7 and FIG. 8.

Figure 7:
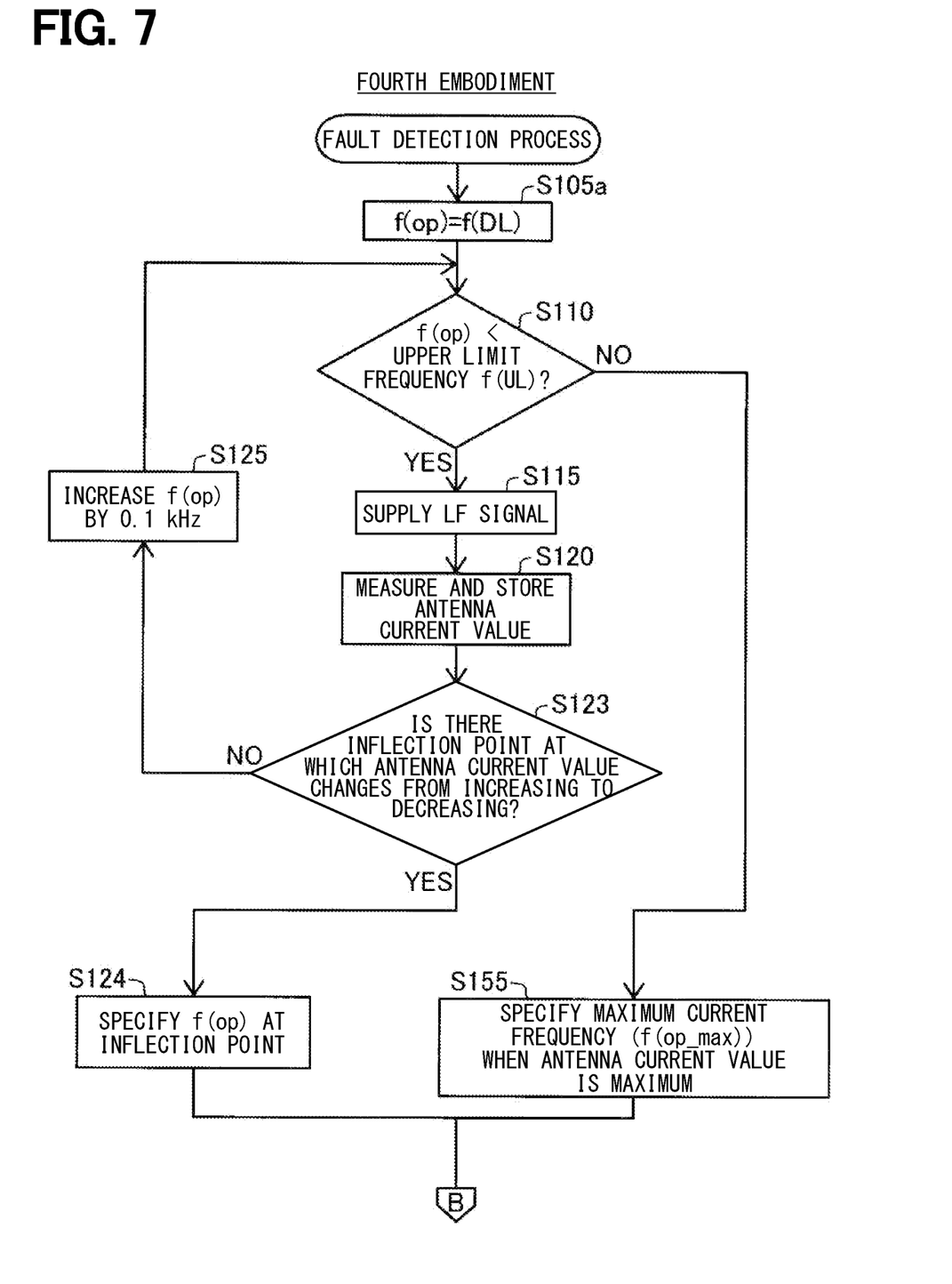
FIG. 7 is a flowchart showing a procedure of a fault detection process according to a fourth embodiment.
Figure 8:
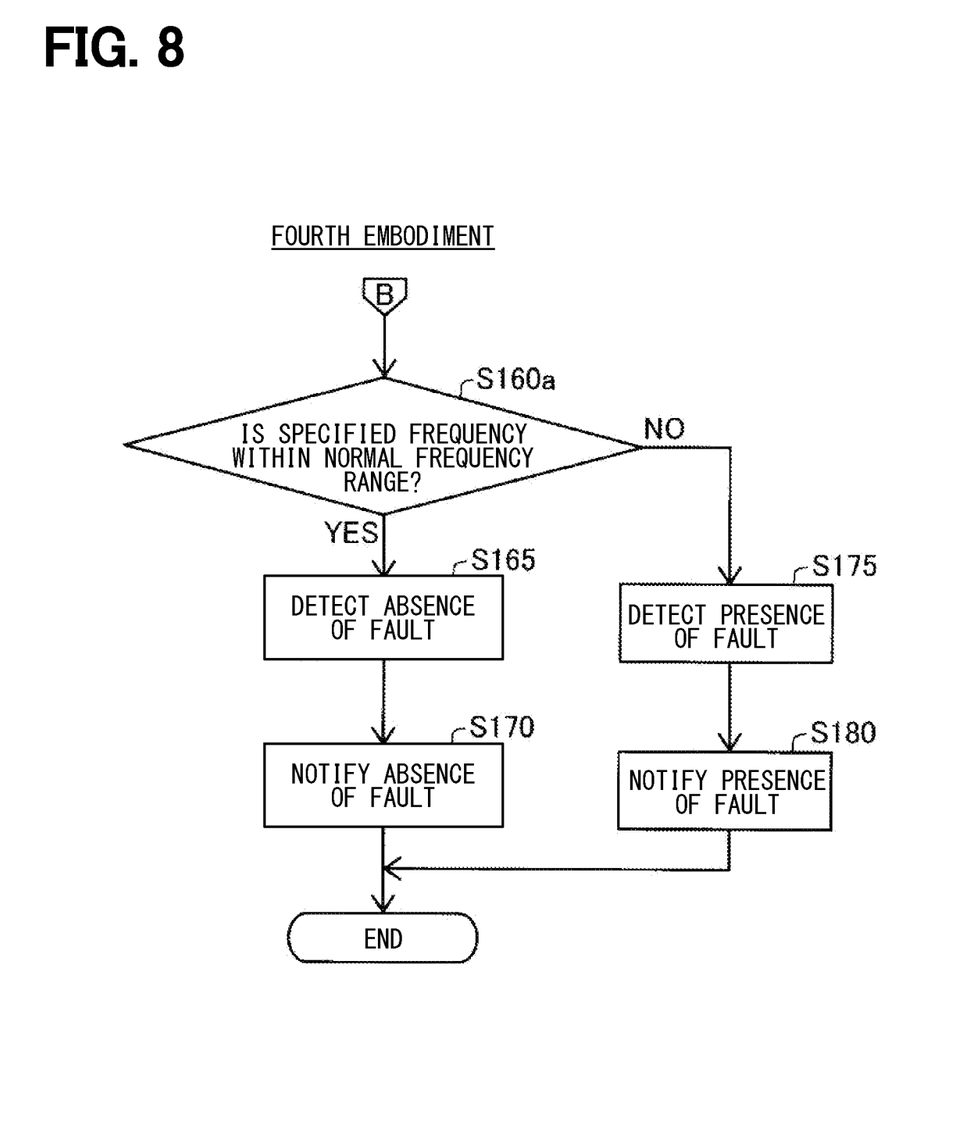
FIG. 8 is a flowchart showing a procedure of the fault detection process according to the fourth embodiment.

A fault detection process of the fourth embodiment shown in FIG. 7 and FIG. 8 is different from the fault detection process of the second embodiment in that S123 and S124 are added and executed, and S160a is executed instead of S160. Since the other procedure of the fault detection process of the fourth embodiment are the same as those of the fault detection process of the second embodiment, the same procedure are designated by the same reference numerals and detailed description thereof will be omitted.

After the measured antenna current value and the frequency f(op) of the carrier wave at this time are stored in the storage 26 in association with each other in S120, the controller 21 determines whether there is an inflection point at which the antenna current value changes from increasing to decreasing, with reference to the history of the antenna current value stored in the storage 26 (S123). When it is determined that there is no inflection point (S123: NO), the above-described S125 is executed, and the frequency f(op) is increased by 0.1 kHz.

On the other hand, when it is determined that there is an inflection point (S123: YES), the controller 21 specifies the frequency f(op) at the inflection point (S124). After that, as shown in FIG. 8, the fault detector 11 determines whether or not the specified frequency is within the normal frequency range (S160a). The normal frequency range is the same as the normal frequency range of the second embodiment. When the above-described S124 is executed, it is determined whether or not the frequency f(op) at the inflection point is within the normal frequency range. After executing S160a, S165 to S180 are executed in the same manner as in the second embodiment described above. The antenna current increases when the frequency f(op) of the carrier wave approaches the resonance frequency of the LF transmission antenna 30, and the antenna current decreases when the frequency f(op) of the carrier wave is away from the resonance frequency. Therefore, when there is an inflection point at which the antenna current value changes from increasing to decreasing, it can be said that the frequency at the inflection point is the frequency closest to the resonance frequency of the vehicle system 300. Therefore, in the fourth embodiment, the frequency at the inflection point is regarded as the maximum current frequency f(op_max), and the presence or absence of a fault is detected and notified based on the frequency at the inflection point.

If the frequency f(op) of the carrier wave reaches the upper limit frequency f(UL) without an inflection point in the middle of increasing the frequency f(op) by 0.1 kHz (S110: NO), the above-described S155 is executed, and then S160a to S180 are executed. Therefore, as in the second embodiment described above, the presence or absence of a fault is detected and notified based on the maximum current frequency f(op_max).

According to the signal supply device 50 of the fourth embodiment described above, effects similar to those of the signal supply device 50 of the first embodiment and the second embodiment are obtained. In addition, when it is determined that there is an inflection point of the antenna current in the process of increasing the frequency by 0.1 kHz from the lower limit frequency f(DL) to the upper limit frequency f(UL), the presence or absence of a fault is detected and notified based on the frequency at the inflection point. Therefore, it is not necessary to transmit the test signal, measure the antenna current, and store the antenna current value in the storage 26 in the entire frequency range of the design tolerance, and the fault detection process can be completed in a short time.

E. Fifth Embodiment

Since the device configuration of the signal supply device 50 of the fifth embodiment is the same as that of the signal supply device 50 of the first embodiment, the same components are designated by the same reference numerals, and detailed description thereof will be omitted. In a fault detection process of the fifth embodiment, a fault caused by a change in an antenna characteristic is detected. In the present embodiment, the "fault caused by the change in the antenna characteristic" means a fault that the characteristic of the LF transmission antenna 30, that is, the resistance value of the resistor, the inductance of the coil, the capacitance of the capacitor, or the like changes over time, and thereby the deviation between the resonance frequency of the LF transmission antenna 30 and the driving frequency (usage frequency) of the signal supply device 50 increases, and the wireless communication performance related to the transmission and reception of the LF signal deteriorates. Therefore, unlike the first embodiment, the fault detection process of the present embodiment is executed after the vehicle 100 is shipped. Hereinafter, the fault detection process of the fifth embodiment will be described with reference to FIG. 9.

Figure 9:
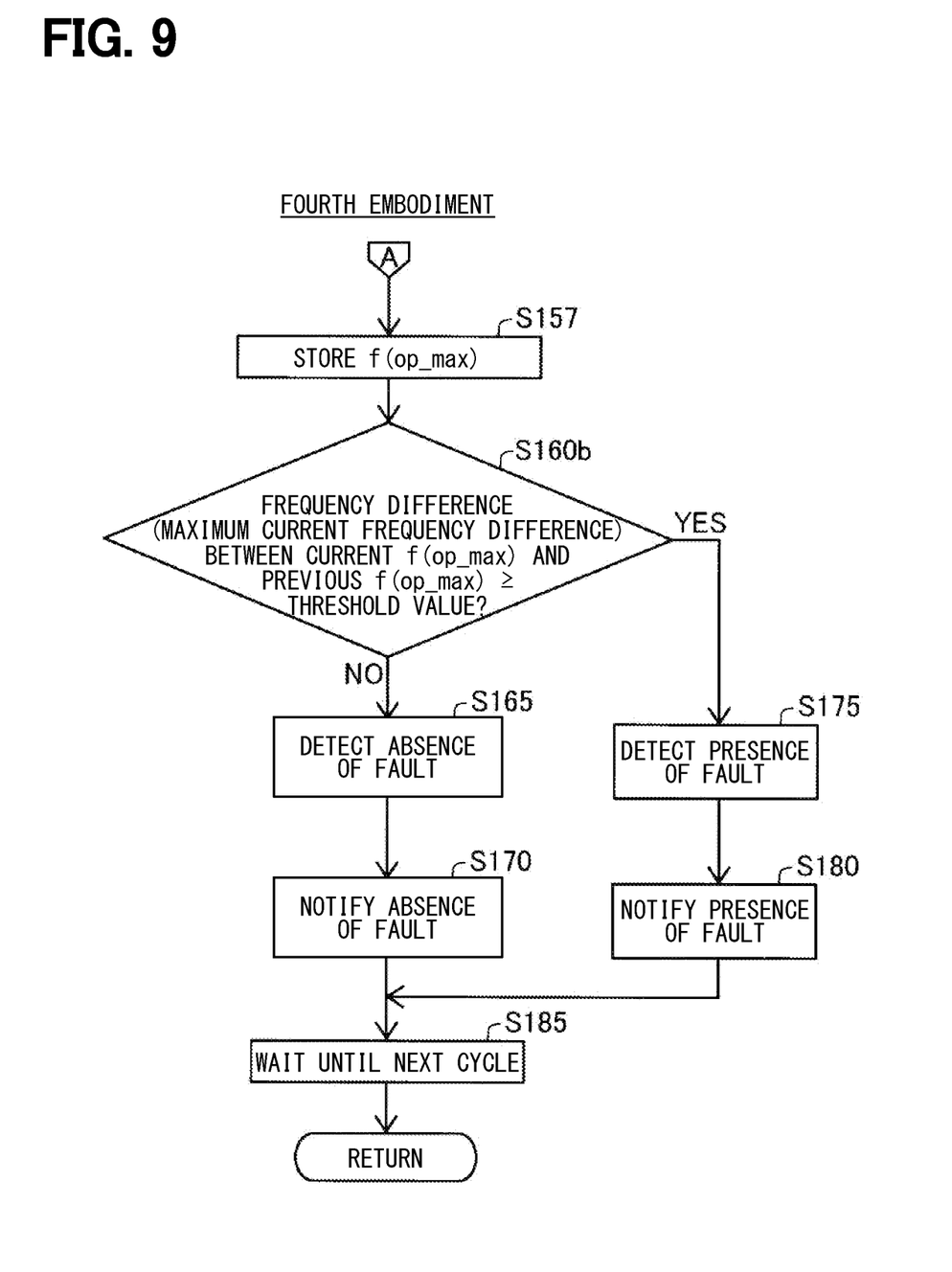
FIG. 9 is a flowchart showing a procedure of a fault detection process according to a fifth embodiment.

As shown in FIG. 9, the fault detection process of the fifth embodiment is different from the fault detection process of the first embodiment shown in FIG. 3 and FIG. 4 in that S157 and S185 are added and executed, S160b is executed instead of S160, and the test signal supply process, the measurement of the antenna current, and the detection and the notification of the presence or absence of a fault are periodically and repeatedly executed. Since the other procedure of the fault detection process of the fifth embodiment are the same as those of the fault detection process of the first embodiment, the same procedure are designated by the same reference numerals and detailed description thereof will be omitted.

When S155 shown in FIG. 3 is executed and the maximum current frequency f(op_max) is specified, the fault detector 11 stores the specified maximum current frequency f(op_max) as shown in FIG. 9 in the storage 12 (S157).

The fault detector 11 determines whether or not a frequency difference between the maximum current frequency f(op_max) specified in S155 executed in the current cycle and the maximum current frequency f(op_max) specified in S155 executed in the previous cycle (hereinafter, referred to as "maximum current frequency difference") is equal to or greater than a predetermined threshold value (S160b). The maximum current frequency f(op_max) does not change when the antenna characteristic does not change, while the maximum current frequency f(op_max) changes when the antenna characteristic changes. Therefore, when the antenna characteristic changes over time, the maximum current frequency f(op_max) changes, and the maximum current frequency difference increases. The threshold value in S160b is a threshold value when the deviation between the resonance frequency of the LF transmission antenna 30 and the drive frequency of the signal supply device 50 due to the secular change of the antenna characteristic causes deterioration of wireless communication quality of a predetermined degree or more, is determined by experiments and the like and is set in advance.

When it is determined that the maximum current frequency difference is not equal to or greater than the threshold value (S160b: NO), S165 and S170 are executed. Therefore, the absence of a fault is detected and notified. On the other hand, when it is determined that the maximum current frequency difference is equal to or greater than the threshold value (S160b: YES), S175 and S180 are executed. Therefore, the presence of a fault is detected and notified.

After executing S170 or S180 described above, the controller 21 waits until the next cycle, and when the next cycle arrives, returns to S105 described above and S105 to S185 are executed again. The execution cycle of the fault detection process of the fifth embodiment is 30 days. Therefore, in S185, the controller 21 waits for about one month and executes S105 to S185 again. The execution cycle of the fault detection process is not limited to 30 days, and may be any period. For example, the execution cycle may be 1 hour, 1 day, 1 week, 1 month, 1 year, 5 years, or the like.

According to the signal supply device 50, that is, the fault detection device of the fifth embodiment described above, the presence or absence of a fault caused by the secular change of the antenna characteristic of the LF transmission antenna 30 by using the value of the maximum antenna current among the antenna currents measured during the execution of the test signal supply process. Therefore, the signal supply device 50 can detect the fault caused by the secular change of the antenna characteristic of the LF transmission antenna 30, specifically, a fault that the resonance frequency of the LF transmission antenna 30 and the driving frequency of the signal supply device 50 deviate from each other and the wireless communication performance deteriorates. When the deviation between the resonance frequency of the antenna and the frequency of the carrier wave is small, the measured antenna current becomes large. Therefore, among the antenna currents measured during the test signal supply process, the frequency of the carrier wave when the maximum antenna current is measured (maximum current frequency f(op_max)) has the smallest deviation from the resonance frequency of the antenna. The frequency with the smallest deviation from the resonance frequency of the antenna differs depending on the antenna characteristic. Therefore, by using the maximum current value frequency f(op_max) that differs depending on such antenna characteristic, it is possible to accurately detect a fault caused by a secular change in the antenna characteristic of the LF transmission antenna 30.

In addition, since the fault of the change in the antenna characteristic is detected when the frequency difference between the maximum current frequency f(op_max) specified in S155 executed in the current cycle and the maximum current frequency f(op_max) specified in S155 executed in the previous cycle is equal to or greater than the predetermined threshold value, the fault of the change in the antenna characteristic can be detected with high accuracy. In addition, according to the signal supply device 50, that is, the fault detection device of the fifth embodiment, effects similar to those of the signal supply device 50, that is, the fault detection device of the first embodiment is obtained.

F. Other Embodiments (F1) In the fault detection process of the first to fourth embodiments, the presence or absence of a fault is detected depending on whether or not the maximum current frequency f(op_max) is within the normal frequency range. However, the present disclosure is not limited to this. When the frequency f(op) of the carrier wave is changed within the frequency range of the design tolerance, the frequency corresponding to one of the antenna current values on the larger side among the antenna current values may be specified, and the presence or absence of a fault may be detected depending on whether or not the specified frequency is within the normal frequency range. Even in such a configuration, compared with a configuration in which the presence or absence of a fault is detected depending on whether or not the frequency corresponding to one of the antenna current values on the smaller side among the antenna current values is within the normal frequency range, a fault caused by differences or changes in the antenna characteristic can be detected more accurately.

(F2) In S155 of the usage frequency adjustment process in each embodiment, the controller 21 specifies the frequency corresponding to the maximum antenna current value by referring to the antenna current values and the frequencies stored in the storage 26. However, the present disclosure is not limited to this. For example, each time the antenna current value is measured, the measured antenna current value may be overwritten and saved if it is larger than the antenna current value stored in the storage 26, and may not be stored in the storage 26 if it is smaller. In such a configuration, in S155, the frequency finally stored in the storage 26 may be specified as the maximum current frequency f(op_max).

(F3) In the first and fifth embodiments, the order of executing S105 to S125 and S130 to S150 may be changed. Further, S123 and S124 of the fourth embodiment may be added to the third embodiment. Specifically, S123 may be executed after S145, and when it is determined that there is an inflection point, S124 described above may be executed, and when it is determined that there is no inflection point, S150 described above may be executed. Even in such a configuration, effects similar to those of the third embodiment and the fourth embodiment are obtained.

(F4) The fault detection process of each embodiment has been executed for the antenna (LF transmission antenna 30) and the signal supply device (signal supply devices 50, 50a) for transmitting the signal in the LF band, but the present disclosure is not limited to this. The usage frequency adjustment process of each embodiment may be executed for a resonance frequency of another antenna that outputs a signal of any frequency band and another signal supply device that supplies an output target signal to the antenna. For example, the fault detection process of each embodiment may be executed for an antenna and a signal supply device for transmitting a signal in any frequency band such as a VLF (Very Low Frequency) frequency band of 3 kHz to 30 kHz and an MF (Medium Frequency) frequency band of 300 kHz to 3 MHz.

(F5) In the fifth embodiment, a fault caused by a secular change in the antenna characteristic of the LF transmitting antenna 30 has been detected, but the present disclosure is not limited to this. The fault detection process can detect a fault caused by a change in the resonance frequency of the LF transmission antenna 30 due to a change in the installation environment of the LF transmission antenna 30 after the vehicle 100 is shipped, that is, a fault in which the wireless communication quality deteriorates due to a deviation between the resonance frequency of the LF transmission antenna 30 and the drive frequency of the signal supply device 50. Specifically, a fault can be detected, for example, even when the resonance frequency of the LF transmission antenna 30 changes because the user has installed a metal member, for example, a mounting bracket for mounting a display device in the vicinity of the LF transmission antenna 30. Even in such a case, since the resonance frequency of the LF transmission antenna 30 changes, the frequency when the antenna current is maximum changes, and the maximum current frequency difference increases. Therefore, according to the fault detection process of the fifth embodiment described above, such a fault can be detected.

(F6) In the fifth embodiment, a fault is detected based on the difference between the maximum current frequency f(op_max) specified in S155 executed in the current cycle and the maximum current frequency f(op_max) specified in S155 executed in the previous cycle, but the present disclosure is not limited to this. For example, when the vehicle 100 is manufactured, S105 to S155 may be executed in advance to specify the maximum current frequency f(op_max), and the specified maximum current frequency f(op_max) may be stored in the storage 12 as an initial value. Then, in the fault detection process executed periodically thereafter, the frequency difference between the initial value and the maximum current frequency f(op_max) specified in S155 executed in the current cycle may be specified, and the presence of a fault may be detected when the frequency difference is equal to or greater than a predetermined threshold value, and the absence of a fault may be detected when the frequency difference is less than the threshold value.

(F7) In the first to fourth embodiments, it is the signal supply device 50 that executes the fault detection process, but another device other than the signal supply device 50 may execute the fault detection process. For example, a dedicated test device may execute the fault detection process. In this configuration, the fault detection process may be executed after the dedicated device is electrically connected to each LF transmission antenna 30 and the notifier 500. In such a configuration, the dedicated test device corresponds to a subordinate concept of the fault detection device in the present disclosure.

(F8) The configuration of the signal supply device 50 in each embodiment is merely an example and can be changed in various ways. For example, in each embodiment, the CPU 10 constitutes a part of an in-vehicle device (ECU) for realizing remote keyless entry, but a CPU different from the in-vehicle device may be used. Further, in each embodiment, each function of the LF transmission control IC 20 may be realized by a plurality of ICs. Further, in each embodiment, a part of the functions of the LF transmission control IC 20 may be realized by the CPU 10. Further, in each embodiment, the amount of change when changing the frequency f(op) of the carrier wave does not have to be constant. For example, the amount of increase in S125 and the amount of decrease in S150 may be different from each other. Further, the notifier 500 may be configured to include a speaker in addition to the liquid crystal display or in place of the liquid crystal display, and the notification may be executed by outputting the detection result of the presence or absence of a fault by voice from the speaker. In addition, the notifier 500 may notify the detection result of the presence or absence of a fault by controlling a lighting state of a predetermined lamp. For example, the presence of a fault may be notified by blinking the red lamp. Further, the absence of a fault may be notified, for example, by turning on the green lamp. Further, the notifier 500 may be omitted. In such a configuration, for example, the detection result of the presence or absence of a fault may be stored in the storage 12 or the like as a history. Further, in each embodiment, the usage frequency is fixed to the initial value f(int), but the frequency specified in S155 or S124 of the fault detection process may be set as the usage frequency. Accordingly, even if a difference or a change in the antenna characteristic occurs, it is possible to suppress the occurrence of a deviation between the resonance frequency of the LF transmission antenna 30 and the drive frequency of the signal supply device 50, and it is possible to suppress a fault that the wireless communication performance deteriorates due to such a deviation.

(F9) The signal supply device 50 and the technique according to the present disclosure may be achieved by a dedicated computer provided by constituting a processor and a memory programmed to execute one or more functions embodied by a computer program. Alternatively, the signal supply device 50 and the technique according to the present disclosure may be achieved by a dedicated computer provided by constituting a processor with one or more dedicated hardware logic circuits. Alternatively, the signal supply device 50 and the technique according to the present disclosure may be achieved using one or more dedicated computers constituted by a combination of a processor and a memory programmed to execute one or more functions and a processor with one or more hardware logic circuits. The computer program may be stored, as instructions to be executed by a computer, in a tangible non-transitory computer-readable medium.

The present disclosure should not be limited to the embodiments described above, and various other embodiments may be implemented without departing from the scope of the present disclosure. For example, the technical features in each embodiment corresponding to the technical features in the form described in the summary may be used to solve some or all of the above-described problems, or to provide one of the above-described effects. In order to achieve a part or all, replacement or combination can be appropriately performed. Also, if the technical features are not described as essential in the present specification, they can be deleted as appropriate.

What is claimed is:

1. A fault detection device for detecting a fault of an antenna, comprising:
    a frequency adjuster configured to adjust a frequency of a carrier wave;
    a modulator configured to modulate the carrier wave with an input signal;
    an amplifier configured to amplify the input signal that is modulated to generate an output target signal and supply the output target signal to the antenna;
    a current measurer configured to measure an antenna current that flows through the antenna;
    a fault detector configured to detect the fault; and
    a controller, wherein
    while the controller executes a test signal supply process in which the controller controls the frequency adjuster to change the frequency of the carrier wave within a frequency range predetermined as a range of a resonance frequency of the antenna, controls the modulator to modulate the carrier wave with a test signal as the input signal, and controls the amplifier to amplify the carrier wave that is modulated and supply the carrier wave that is amplified as the output target signal to the antenna, the controller controls the current measurer to measure the antenna current corresponding to the frequency each time the frequency of the carrier wave is changed, and
    the controller repeatedly executes the test signal supply process and measurement of the antenna current corresponding to the frequency for each frequency of the carrier wave in a predetermined cycle, wherein the test signal supply process is executed for a plurality of cycles, and
    the fault detector detects the fault that the characteristic of the antenna changes when a frequency difference, which is a difference between the frequency corresponding to a maximum value of the antenna current measured for each frequency of the carrier wave during execution of the test signal supply process in a current cycle of the plurality of cycles and the frequency corresponding to a maximum value of the antenna current measured for each frequency of the carrier wave during execution of the test signal supply process in a previous cycle of the plurality of cycles, is equal to or greater than a predetermined threshold value.

2. The fault detection device according to claim 1, wherein
    the fault detector detects the fault that the antenna having the characteristic different from the characteristic of a correct antenna is assembled when the frequency corresponding to a maximum value of the antenna current measured during execution of the test signal supply process is out of a range of a frequency band corresponding to a current value assumed in a case where the test signal supply process is executed in a state where the correct antenna is assembled.

3. The fault detection device according to claim 1, wherein
    in the test signal supply process, the controller performs either one of increase or decrease of the frequency within the frequency range in order from an initial value predetermined as a usage frequency, and when the frequency reaches a critical value in the frequency range, the controller performs the other of increase or decrease in the frequency range from the initial value to another critical value in the frequency range.

4. The fault detection device according to claim 3, further comprising
    a storage configured to store a value of the antenna current measured for each frequency of the carrier wave in the test signal supply process, wherein
    the fault detector is configured to detect the fault by referring to the value of the antenna current stored in the storage in the test signal supply process.

5. The fault detection device according to claim 1, further comprising
    a notification controller configured to control a notifier to notify the detection of the fault when the fault is detected.

6. The fault detection device according to claim 1, wherein
    the frequency of the carrier wave is in a range from 30 kHz to 300 kHz.

7. A fault detection device for detecting a fault of an antenna, comprising:
    a central processing unit (CPU) configured to detect the fault; and
    an integrated circuit (IC) configured to:
        adjust a frequency of a carrier wave;
        modulate the carrier wave with an input signal;
        amplify the input signal that is modulated to generate an output target signal and supply the output target signal to the antenna; and
        measure an antenna current that flows through the antenna, wherein
    while the IC executes a test signal supply process for changing the frequency of the carrier wave within a frequency range predetermined as a range of a resonance frequency of the antenna, modulating the carrier wave with a test signal as the input signal, amplifying the carrier wave that is modulated, and supplying the carrier wave that is amplified as the output target signal to the antenna, the IC measures the antenna current corresponding to the frequency each time the frequency of the carrier wave is changed,
    the IC repeatedly executes the test signal supply process and measurement of the antenna current corresponding to the frequency for each frequency of the carrier wave in a predetermined cycle, wherein the test signal supply process is executed for a plurality of cycles, and
    the CPU detects the fault that the characteristic of the antenna changes when a frequency difference, which is a difference between the frequency corresponding to a maximum value of the antenna current measured for each frequency of the carrier wave during execution of the test signal supply process in a current cycle of the plurality of cycles and the frequency corresponding to a maximum value of the antenna current measured for each frequency of the carrier wave during execution of the test signal supply process in a previous cycle of the plurality of cycles, is equal to or greater than a predetermined threshold value.

8. A fault detection device comprising a processor and a memory, the memory storing instructions configured to, when executed by the processor, cause the processor to perform:
    execution of a test signal supply process for changing a frequency of a carrier wave within a frequency range predetermined as a range of a resonance frequency of an antenna, modulating the carrier wave with a test signal as an input signal, amplifying the carrier wave that is modulated, and supplying the carrier wave that is amplified as an output target signal to the antenna;

measurement of an antenna current corresponding to the frequency each time the frequency of the carrier wave is changed while executing the test signal supply process, the antenna current being an electric current that flows through the antenna; and detection of a fault caused by a difference or a change in a characteristic of the antenna, wherein the instructions are further configured to, when executed by the processor, cause the processor to:

repeatedly perform the execution of the test signal supply process and the measurement of the antenna current corresponding to the frequency for each frequency of the carrier wave in a predetermined cycle, wherein the test signal supply process is executed for a plurality of cycles; and detect the fault that the characteristic of the antenna changes when a frequency difference, which is a difference between the frequency corresponding to a maximum value of the antenna current measured for each frequency of the carrier wave during execution of the test signal supply process in a current cycle of the plurality of cycles and the frequency corresponding to a maximum value of the antenna current measured for each frequency of the carrier wave during execution of the test signal supply process in a previous cycle of the plurality of cycles, is equal to or greater than a predetermined threshold value.

* * * * *